United States Patent [19]

Blanchard

[11] 4,402,003
[45] Aug. 30, 1983

[54] COMPOSITE MOS/BIPOLAR POWER DEVICE

[75] Inventor: Richard A. Blanchard, Los Altos Hills, Calif.

[73] Assignee: Supertex, Inc., Sunnyvale, Calif.

[21] Appl. No.: 224,078

[22] Filed: Jan. 12, 1981

[51] Int. Cl.³ .................................... H01L 57/02
[52] U.S. Cl. ........................... 357/43; 357/13; 357/46; 357/51; 357/86; 357/23; 307/304; 307/318
[58] Field of Search ............ 357/43, 13, 86, 51, 357/46, 23 VD; 307/304, 318

[56] References Cited

U.S. PATENT DOCUMENTS

| | | | |
|---|---|---|---|
| 3,553,541 | 1/1971 | King | 357/43 X |
| 4,057,844 | 11/1977 | Smedly | 307/304 X |
| 4,143,391 | 3/1979 | Suzuki | 357/43 X |
| 4,255,671 | 3/1981 | Nonaku | 357/43 X |

*Primary Examiner*—Martin H. Edlow
*Attorney, Agent, or Firm*—Harry M. Weiss

[57] ABSTRACT

A merged MOS/bipolar structure for high current device applications. Using the same process sequence both an MOS device as a bipolar device are formed in a single semiconductor substrate. Integral input circuitry means couples the input terminals of the individual devices to the composite input terminal to control the relative currents carried by the individual devices as a function of the input signal.

15 Claims, 3 Drawing Figures

COMPOSITE MOS/BIPOLAR POWER DEVICE

REFERENCE TO RELATED APPLICATION

This application is related to an application of Henry Pao, Richard A. Blanchard, and Benedict C. K. Choy, entitled "Combined DMOS and Vertical Bipolar Transistor Device and Fabrication Method Therefor", Ser. No. 139,793, filed Apr. 14, 1980, and assigned to Supertex, Inc.

BACKGROUND OF THE INVENTION

1. Field of the Invention

This invention relates generally to improved semiconductor power devices and more specifically to devices containing both FET and bipolar portions interconnected to share the current in a way that optimizes the capabilities of both portions.

2. Description of the Prior Art

Heretofore, known combinations of FET and bipolar devices have in the main comprised arrangements where one or more MOS devices were connected to control the base current of a bipolar device. Such arrangements were contrived both because the combination was susceptible to simple integration or merger and because it was difficult to produce high-current FET devices at high yield.

With the advent of practical high current FET devices, it is advantageous for some applications to eliminate the bipolar transistor altogether. In other applications, a parallel combination of FET and bipolar devices provides improved results. Such an arrangement is described in the related application cited hereinbefore and which is hereby expressly incorporated by reference for its inclusion of fabricational details. In that application, a preferred embodiment of the composite device included separate input terminals for the FET device and for the bipolar device; by appropriate sequencing of input signals during turn-off the advantage of the low "on" voltage of the bipolar device could be retained while largely obviating its potentially destructive latchback. The separate input terminals add complexity to both the drive circuitry for the device and its packaging.

SUMMARY OF THE INVENTION

It is an object of this invention to provide improved integrated semiconductor power devices and a method of operation therefor.

It is another object of this invention to provide an improved integrated power device comprising both a FET element and a bipolar element and a method of operation therefor.

It is a further object of this invention to provide an improved power device where both a FET element and a bipolar element share the output current and a method of operation therefor.

It is yet another object of this invention to provide an improved power device wherein a FET element and a bipolar element integrated in a unitary semiconductor substrate each have individual input terminals and the output current is shared in an improved manner by means of integral individual input circuitry.

In accordance with one embodiment of this invention, merged MOS and bipolar devices with parallel main output terminals have individual inputs coupled through a low-voltage semiconductor device which serves to keep the bipolar transistor out of conduction until the input signal increases beyond a predetermined value substantially corresponding to the maximum current through the FET device. Further increases in the input signal essentially enhance the conduction in the bipolar device only.

In another embodiment, the current through the FET increases temporarily as the bipolar device turns off to help prevent second breakdown.

Embodiments of the merged device include the alternatives of making the base of the bipolar device common with the body region of the MOS device or physically and electrically separating the two.

The foregoing and other objects, features and advantages of the invention will be apparent from the following more detailed description, as illustrated in the accompanying drawings.

THE SPECIFICATION

Figure 1:
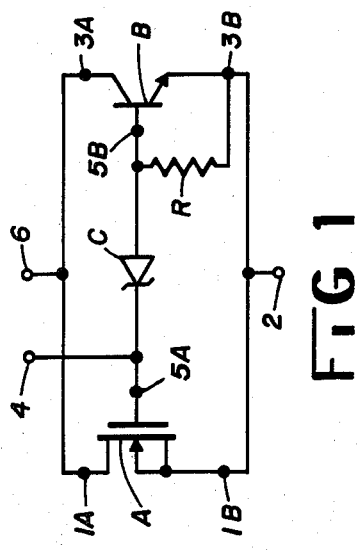
FIG. 1 is an electrical schematic representation of the merged device.

FIG. 1 is illustrative of the desired connection of the elements of the merged device. In this Figure A is the MOS portion and B is the bipolar portion of the merged device. The output terminals (1A, 1B, 3A, and 3B) of each portion are coupled in parallel to main output terminals 2 and 6 which are for external connection. The inut terminals (5A, 5B) of each portion are coupled through semiconductor device C, here represented as a zener diode. The common external main input terminal 4 connects directly to the input (gate) of the MOS portion of the device and indirectly through the zener diode C to the input base (base) of the bipolar portion of the device. Optional resistor R may be used to keep the bipolar device from turning on due to undesired leakage through zener diode C.

In operation, a load and a supply voltage are serially connected across terminals 2 and 6, and an input signal is provided at common main input terminal 4.

Only the MOS device A conducts as long as the input signal is less than the blocking voltage of zener diode C. As the input voltage is increased above the blocking voltage, the bipolar device begins to conduct. Because the base terminal of a bipolar power transistor represents a low impedance, large increases in conduction in the bipolar device B can occur without substantial increases in the input voltage and the current in MOS device A will be correspondingly limited.

The advantages of this composite configuration may be explained by comparison with the results were either device operated alone. For an MOS device, the minimum "on" voltage across the main terminals is proportional to the main terminal current divided by the gate voltage above threshold. Thus a large gate voltage is required to achieve low device impedance. For the bipolar device operated alone, the "on" voltage (and the base input voltage as well) will be slightly less than one volt over a large range of main terminal currents. Thus low "on" voltages are maintained as long as sufficient base input current is supplied. But because the main terminal current rises exponentially with the base input voltage (with a sharp increase in conduction around 600 millivolts and moderately low currents) non-linearities in the transfer characteristic preclude the use of a bipolar device in many applications.

Because the MOS device has an approximate square law transfer characteristic, its non-linearities are much less serious. Thus by operation of the MOS device only at low currents and combined operation of both devices at higher currents, both reasonable linearity and low "on" voltage may be had.

The "on" voltages will be proportional to any parasitic series resistance in the device as well. Because it requires relatively more semiconductor area to achieve low parasitic resistance (and high currents) in a MOS device than in a bipolar device, the composite structure provides additional benefits by reducing costs (which are substantially proportional to semiconductor area).

Figure 1A:
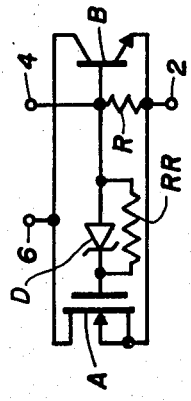
FIG. 1A is a schematic representation of an alternative embodiment.

An alternative embodiment is shown schematically in FIG. 1A, which differs from FIG. 1 in that a semiconductor device D is in series with the input of the MOS transistor A. This configuration is useful in high-power fast switching applications. Ordinarily a bipolar transistor is limited in turn-off speed because of destructive second breakdown when the input current is reversed to turn off the device rapidly where an inductive load sustains high currents as the main terminal voltage rises. In the operation of the composite device of FIG. 1A, fast-turn on may be achieved by applying a large current to the input terminal 4. Forward-biased diode D will let the MOS device come on rapidly, but it will carry substantially less current than the bipolar device because of the larger "on" voltage of the MOS device. When the input signal at terminal 4 is made negative to pull current from the base of the bipolar transistor B, diode D will be reverse-biased, tending to turn off the MOS device at a rate depending on its gate capacitance and the resistance of RR. As the terminal 6 voltage rises due to the load inductance, MOS device A will remain turned on by the charge on its gate that has not been removed by the reverse bias on terminal 4 and will thus carry a large current to reduce the current stress on bipolar device B, preventing destructive second breakdown. When the voltage at terminal 6 approaches that of the power supply and bipolar transistor B is no longer conducting, the voltage at the gate of MOS transistor A falls to that of the input signal applied to terminal 4 by current flow through resistor RR. Because destruction may take place in a period as short as a few tens of nanoseconds, only by having the separate devices merged in an integrated embodiment will the response be sufficiently fast to be efficacious. An additional benefit of the merged construction is that the MOS transistor shunts the bipolar transistor locally rather than just at the high-voltage main terminal. This distinction is crucial since turn-off failure of a bipolar device usually results when the relatively constant current maintained by the inductive load is focused or localized because substantial portions of the bipolar device turn off before the remainder.

Figure 2:
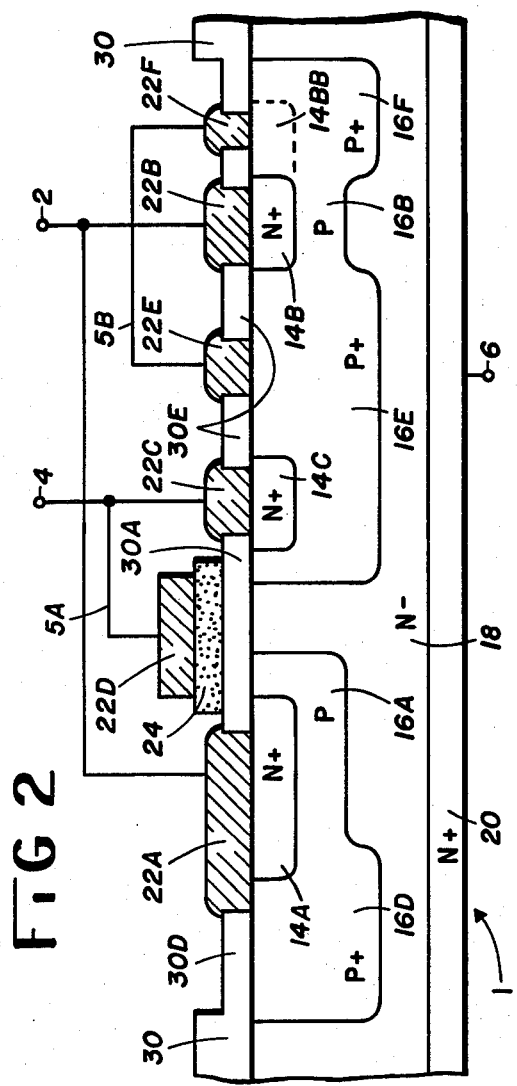
FIG. 2 is a preferred integrated physical embodiment of the merged device.

FIG. 2 illustrates a preferred merged embodiment of the composite device shown schematically in FIG. 1. In FIG. 2, a unitary semiconductor substrate 1 comprises all the devices illustrated in FIG. 1. On the left of this Figure is found the MOS device consisting of body region 16A, source region 14A, drain region 18 and enhanced conductivity drain region 20, gate insulator 30A, and gate conductive means 24. Insulating layer portions 30, 30A, 30D, and 30E serve to passivate the junctions as well as to insulate metallic conductors from the substrate. Metallic conductor 22A shorts the source 14A of the MOS device to its body region 16A while metallic conductor 22D serves to connect to a gate conductor 24 such as polycrystalline silicon which may provide distributed gate resistance.

On the right of FIG. 2 is found the bipolar device consisting of emitter region 14B, base region 16B, collector region 18, and enhanced conductivity collector region 20. Enhanced conductivity portions 16D, 16E and 16F of the same type as body region 16A and base region 16B serve to make good ohmic connections with these regions as well as to control the junction breakdown voltage. Where the semiconductor device C is a zener diode, its cathode is region 14C and its anode is region 16E merged with the base of the bipolar transistor. Resistor R may be implemented by the dashed extension 14BB of emitter region 14B having separate metallic connection means 22F. Metallic connection means 22E and 22B make contact with the base and emitter respectively of the bipolar transistor. For convenience, interconnections between the integrated components have been shown schematically in FIG. 2; those skilled in the art will recognize that these interconnections will be integral extensions of the various regions 22. These extensions will lie over appropriate portions of the insulating layer 30 to isolate them from the semiconductor regions. The N+ region 20 could alternatively be located on the top surface of the device.

Also clear to those skilled in the art is that various portions of the integral semiconductor elements are formed from mask-delineated doped semiconductor regions formed simultaneously in the process sequence. For example, MOS source region 14A, bipolar emitter region 14B, and diode cathode region 14C are all derived from a common semiconductor doping step. Likewise MOS body region 16A and bipolar base region 16B arise from a common doping step as do enhanced conductivity regions 16D, 16E and 16F. For specificity, the various regions have been labeled with P and N conductivity types to illustrate the function of an NPN bipolar transistor and an N-channel MOS transistor; reversed conductivity types could be used to provide the complementary devices. Reference is again made to the copending application hereinbefore cited for more details of a preferred fabrication sequence.

Figure 3:
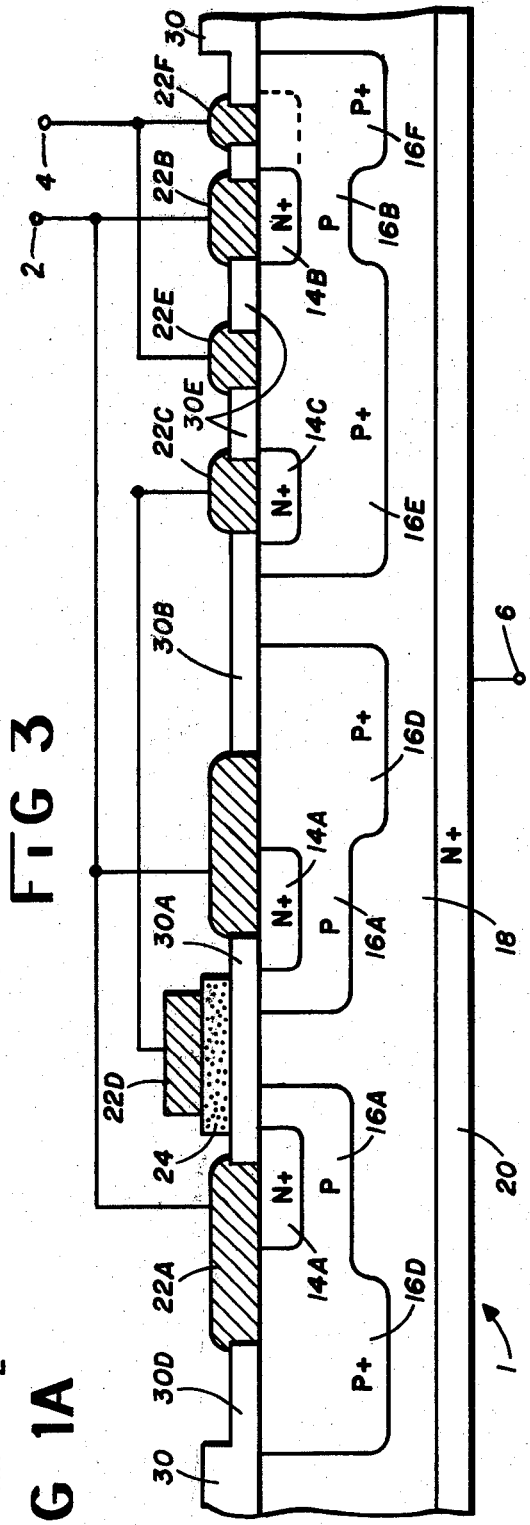
FIG. 3 is a cross-sectional view of a possible embodiment of the device of FIG. 1A.

FIG. 3 shows a possible embodiment of the device of FIG. 1A. Diode D comprises anode region 16E and cathode region 14C. If resistor RR of FIG. 1A is used, it may be incorporated as a polycrystalline silicon region lying on insulator 30 and connected in series with terminal 2 and the gate 22D.

While FIGS. 2-3 show only very simple configurations for the sake of clarity, it will be appreciated that the complete composite device extends into the plane of the drawings to provide substantial current-carrying capability. In the omitted dimension, the devices may consist for example of interdigitated and/or sinuous regions to afford substantial conduction in both devices. Reference is again made to the co-pending application for additional details. That both distributed devices are merged in parallel over substantial portions of the composite device is particularly important not only for area saving but also for performance where the MOS device is used to protect the bipolar device during turn-off.

While the invention has been particularly shown and described with reference to preferred embodiments thereof, it will be understood by those skilled in the art that various modifications may be made without departing from the spirit and scope of the invention. For example, the relative conduction in the MOS and bipolar devices may be varied by the inclusion of additional integral devices in one or both of the individual input circuits. The semiconductor device or devices comprised of the input circuitry may have voltage-current characteristics different than the zener diode illustrated. For example, with embodiment of FIG. 1, the diode C might be replaced with a serial string of diodes conducting current in the forward direction from the input terminal 4 to the base of the bipolar transistor. In FIG. 2, the FET device may lie on both sides of the bipolar device, and/or the FET may be symmetrical about the gate structure in order to improve its current-carrying capability.

What is claimed is:

1. An integrated semiconductor device comprising in combination a bipolar transistor element and a FET element each sharing main output terminals and each having an individual input terminal, and input circuit means for coupling each of said individual inputs to a common main input terminal, said input circuit means comprising semiconductor device means for serially coupling said main input terminal to the input terminal of at least one of said elements.

2. The device of claim 1 wherein said semiconductor device is a zener diode connected in series with the input terminal of the bipolar transistor element.

3. The device of claim 2 wherein said zener diode is connected to be reverse-biased when said main input terminal is poled to cause said bipolar transistor element to conduct.

4. The device of claims 2 or 3 wherein said main input terminal is connected directly to the input terminal of said FET element.

5. The device of claim 1 wherein said FET and bipolar transistor elements are merged in parallel over substantial portions of the device.

6. The device of claim 1 wherein said FET element comprises a gate having substantial distributed resistance and capacitance.

7. The device of claim 6 wherein said common main input terminal is connected directly to the base of said bipolar transistor element.

8. The device of claims 6 or 7 wherein said semiconductor device comprises a zener diode serially connected between the gate of the FET element and the common main input terminal.

9. The device of claims 6 or 7 further including a resistor coupled between the gate of the FET element and the common main input terminal.

10. The device of claim 1 further including shunt conductance means connected across the input of at least one of said elements.

11. The device of claim 1 wherein said elements share a first common semiconductor region comprising one of said main output terminals.

12. The device of claim 11 wherein said elements share a second common semiconductor region comprising the other of said main output terminals.

13. The device of claims 1 or 11 wherein the base of said bipolar transistor element and the body of said FET element comprise a common semiconductor region.

14. The device of claims 1, 2, 3, 4, 5, 6, 7, 8, 9, 10, 11, 12 or 13 wherein said FET element is a MOS device.

15. A method for improved semiconductor device operation comprising the steps of:
providing in unitary integration a bipolar transistor element and a FET element each sharing main output terminals and each having an individual input, and input circuit means for coupling each of said individul inputs to a common main input terminal, said input circuit means comprising semiconductor device means for serially coupling said main input terminal to the input terminal of at least one of said elements; and
providing a load and a supply voltage serially connected across said main output terminals; and
varying the voltage at said main input terminal to control the proportion of main output terminal current carried by each of said elements.

* * * * *